US008289088B2

(12) United States Patent  
Dixit et al.

(10) Patent No.: US 8,289,088 B2
(45) Date of Patent: Oct. 16, 2012

(54) INVERTING DIFFERENCE OSCILLATOR

(75) Inventors: Anand Dixit, Mountain View, CA (US); Robert P. Masleid, Monte Sereno, CA (US)

(73) Assignee: Oracle America, Inc., Redwood Shores, CA (US)

( * ) Notice: Subject to any disclaimer, the term of this patent is extended or adjusted under 35 U.S.C. 154(b) by 164 days.

(21) Appl. No.: 12/495,088

(22) Filed: Jun. 30, 2009

(65) Prior Publication Data

US 2010/0327982 A1  Dec. 30, 2010

(51) Int. Cl.  
*H03K 3/03* (2006.01)  
*G01R 23/175* (2006.01)  
*G01R 31/27* (2006.01)

(52) U.S. Cl. ..... 331/57; 331/44; 324/762.01; 324/76.51

(58) Field of Classification Search .................. 331/57, 331/44, 177 R, 179; 327/261, 264, 276, 327/278, 284, 285, 291; 324/520, 750.3, 762.01, 762.03, 769.09, 76.51

See application file for complete search history.

(56) References Cited

U.S. PATENT DOCUMENTS 6,867,613 B1 * 3/2005 Bienek .................... 324/750.3  
2007/0247240 A1 * 10/2007 Morini et al. .................. 331/57

* cited by examiner

*Primary Examiner* — Ryan Johnson  
(74) *Attorney, Agent, or Firm* — Park, Vaughan, Fleming & Dowler LLP; Anthony P. Jones

(57) ABSTRACT

The described embodiments provide a configurable pulse generator circuit. More specifically, the described embodiments include a pulse generator circuit; an inverting difference oscillator (IDO) enabling circuit coupled to the pulse generator circuit; and a disable signal coupled to the IDO enabling circuit. When the disable signal is asserted, the IDO enabling circuit is disabled and the pulse generator circuit is configured as a pulse generator. In contrast, when the disable signal is deasserted, the IDO enabling circuit is enabled and the pulse generator circuit is configured as part of an IDO.

8 Claims, 12 Drawing Sheets

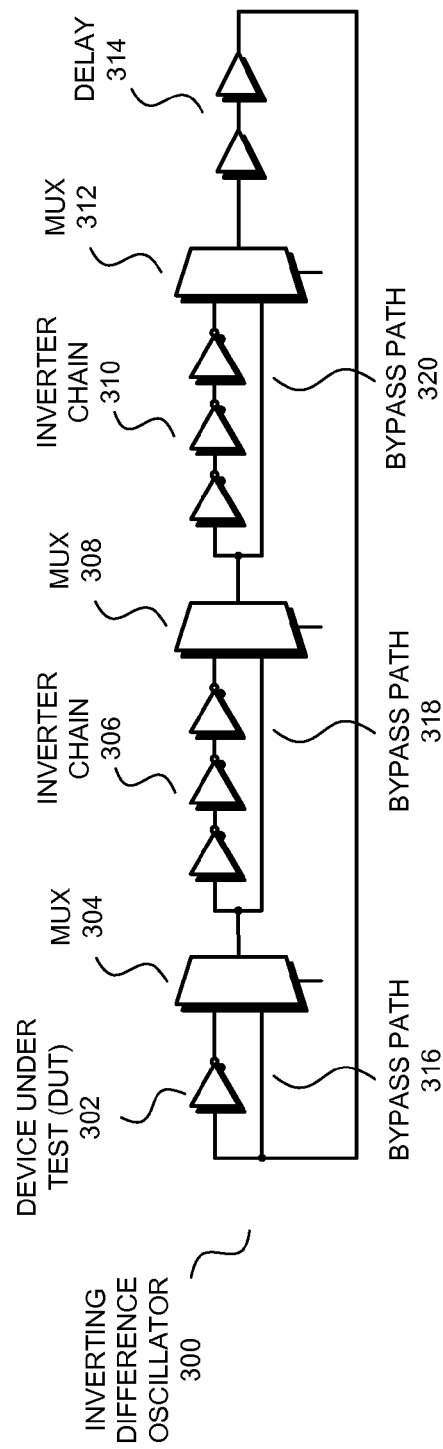
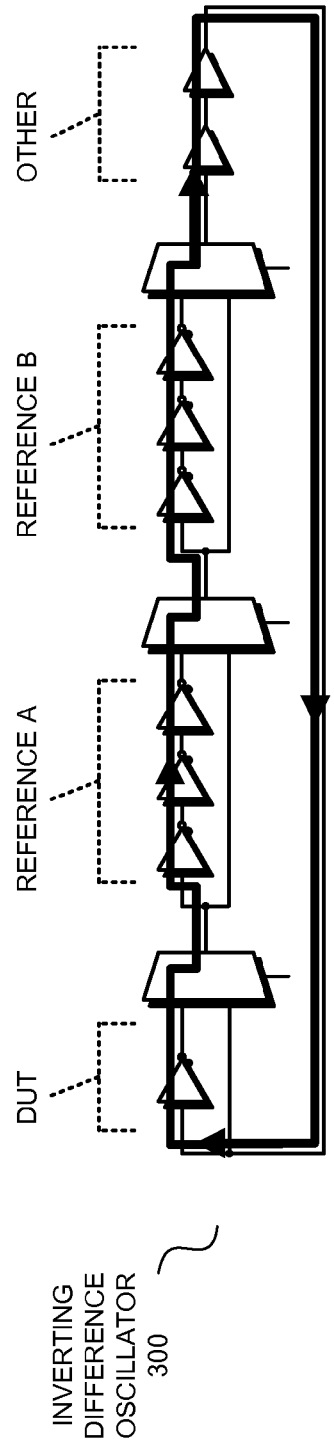
FIG. 3A
FIG. 3B

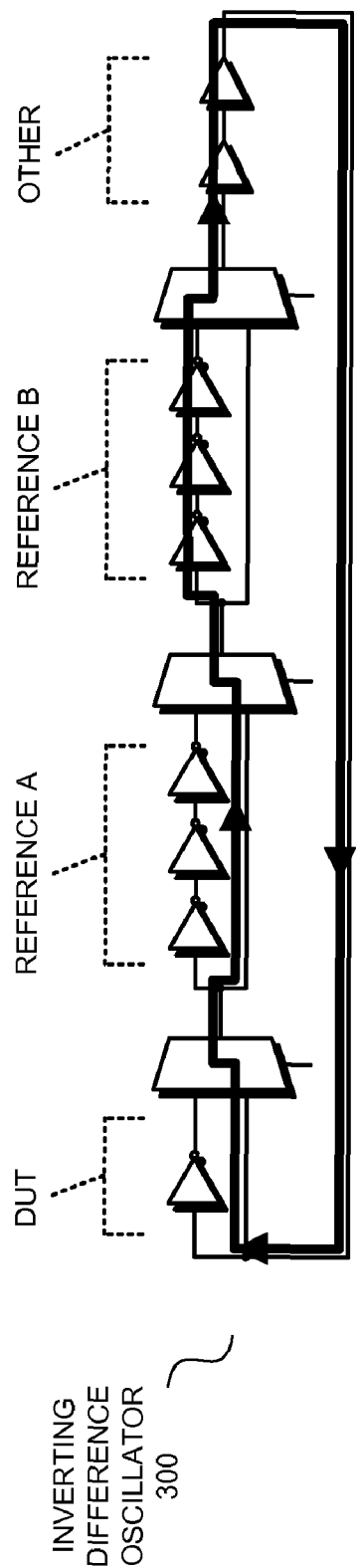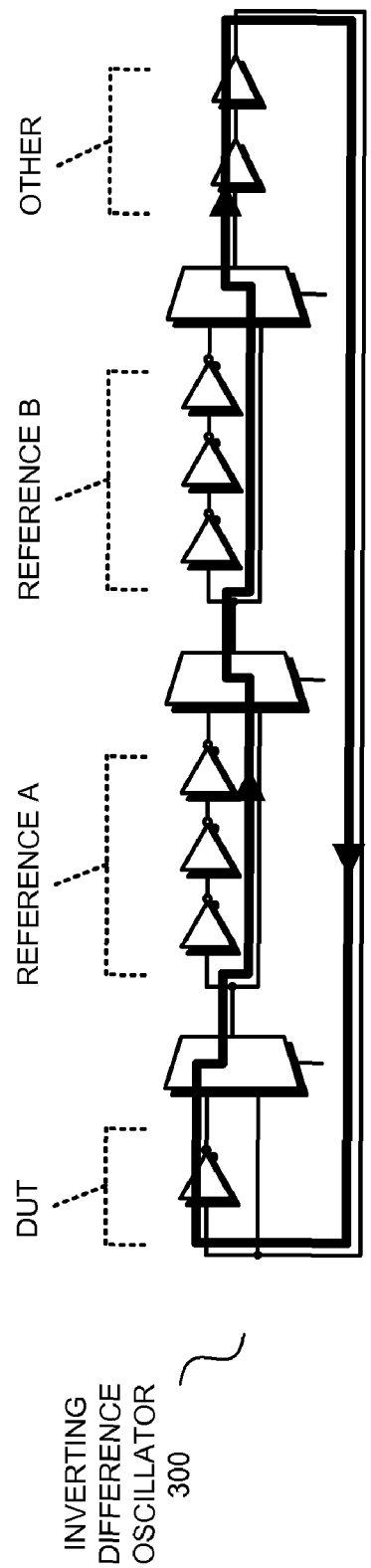

US 8,289,088 B2

INVERTING DIFFERENCE OSCILLATOR

RELATED APPLICATIONS

This application is related to U.S. patent application Ser. No. 12/494,663, entitled "Configurable Pulse Generator," filing date 30 Jun. 2009, by the same inventors, which was issued as U.S. Pat. No. 7,977,995 on 12 Jul. 2011. This application is further related to U.S. patent application Ser. No. 12/425,176, entitled "Economy Precision Pulse Generator," filing date 16 Apr. 2009, by inventors Robert P. Masleid, David J. Greenhill, and Bijoy Kalloor, which was issued as U.S. Pat. No. 7,816,966 on 19 Oct. 2010.

BACKGROUND

1. Field of the Invention

The described embodiments relate to measurement circuits. More specifically, the described embodiments relate to an inverting difference oscillator.

2. Related Art

In modern integrated circuits, circuit designers need to know the precise delay of circuit elements (i.e., logic gates, functional blocks, etc.) in order to effectively optimize a circuit design. Consequently, many techniques have been developed for determining the delay of circuit elements. One such technique involves using a difference oscillator to determine the delay of non-inverting circuit elements.

For example, FIG. 1 presents an exemplary difference oscillator 100 that can be used to measure the delay of a non-inverting circuit element (device under test (DUT) 102). As shown in FIG. 1, difference oscillator 100 includes a multiplexer (MUX) 104 and an inverter chain 106 in a configurable circuit path loop. By using MUX 104, difference oscillator 100 can be configured so that the circuit path loop follows either reference path 108, which excludes DUT 102, or test path 110, which includes DUT 102. Because device 102 is non-inverting and there are an odd number of inversions in inverter chain 106, difference oscillator 100 functions as a ring oscillator regardless of whether the circuit path follows test path 110 or reference path 108.

When measuring the delay of DUT 102, difference oscillator 100 can be operated first in a configuration that uses reference path 108, and then in a configuration that uses test path 110 to determine the oscillating frequency in each configuration. The oscillating frequencies can then be used to determine the difference in the period of the difference oscillator for the two configurations. Next, the delay of DUT 102 can be computed by dividing the determined difference in half.

To determine the delay across the non-inverting DUT 102, difference oscillator 100 must function as a ring oscillator regardless of the configuration of the circuit path loop. More specifically, difference oscillator 100 must function as a ring oscillator both when configured to use reference path 108, where DUT 102 is excluded, and when configured to use test path 110, where DUT 102 is included. Consequently, difference oscillator 100 is limited to applications where a delay is to be determined for a non-inverting DUT 102.

SUMMARY

The described embodiments provide a configurable pulse generator circuit (e.g., pulse generator 202). More specifically, the described embodiments include: the pulse generator circuit; an inverting difference oscillator (IDO) enabling circuit coupled to the pulse generator circuit; and a disable signal coupled to the IDO enabling circuit. When the disable signal is asserted, the IDO enabling circuit is disabled and the pulse generator circuit is configured as a pulse generator. In contrast, when the disable signal is deasserted, the IDO enabling circuit is enabled and the pulse generator circuit is configured as part of an IDO.

Some embodiments include a selection circuit. In these embodiments, one input of the selection circuit is coupled to an output of a previous pulse generator circuit, and another input of the selection circuit is coupled to an output of the pulse generator circuit. A control input of the selection circuit is coupled to the disable signal. When the disable signal is deasserted, the selection circuit is configured to forward the output from the previous pulse generator circuit to the pulse generator circuit. In contrast, when the disable signal is asserted, the selection circuit is configured to forward the output of the pulse generator circuit as a feedback to the pulse generator circuit.

Some embodiments include an n-type metal-oxide-semiconductor field-effect (NMOS) transistor in the pulse generator circuit coupled between an internal node in the pulse generator circuit and VSS. A gate connection for the NMOS transistor is coupled to an output from the selection circuit. In addition, these embodiments include two p-type metal-oxide-semiconductor field-effect (PMOS) transistors in the IDO enabling circuit coupled in series between the internal node in the pulse generator circuit and VDD. A gate connection for the first of the PMOS transistors is coupled to the disable signal, and a gate connection for the second of the PMOS transistors is coupled to the output of the selection circuit.

Some embodiments include a second selection circuit. In these embodiments, one input of the second selection circuit is coupled to the output of the previous pulse generator circuit, and another input of the selection circuit is coupled to the output of the pulse generator circuit. A control input of the selection circuit is coupled to a bypass signal. When the bypass signal is asserted, the second selection circuit is configured to forward the output of the previous pulse generator circuit to a subsequent pulse generator circuit without the signal propagating through a set of inverting circuit elements in the pulse generator circuit. In contrast, when the bypass signal is deasserted, the second selection circuit is configured to forward the output of the pulse generator circuit to the subsequent pulse generator circuit.

In some embodiments, a clock signal is coupled to the pulse generator circuit. When operating as a pulse generator, the pulse generator circuit is configured to output pulses in response to each rising edge of the clock signal.

Some embodiments include a disable signal coupled to the pulse generator circuit. The pulse generator circuit is configured so that the pulse generator circuit is disabled when the disable signal is asserted.

The described embodiments provide an inverting difference oscillator circuit. The inverting difference oscillator circuit includes N stages, each stage including: (1) a circuit element path that includes at least one inverting circuit element; (2) a bypass path; and (3) a selection circuit. One input of the selection circuit is coupled to the circuit element path, and another input of the selection circuit is coupled to the bypass path. An output of the selection circuit is coupled to the bypass path and to the circuit element path in a next stage. Additionally, an output of a selection circuit in a last stage is coupled to the bypass path and to the circuit element path in a first stage to form a circuit path loop.

The inverting difference oscillator also includes N control signals, wherein each control signal is coupled to a separate selection circuit. The control signals can be used to configure the inverting difference oscillator as a ring oscillator by forwarding the output from the circuit element path in selected stages, and forwarding the bypass path in any other stages, to configure the circuit path loop as a ring oscillator that includes an odd number of inverting circuit elements.

BRIEF DESCRIPTION OF THE FIGURES

FIG. 3A presents an inverting difference oscillator in accordance with the described embodiments.

FIGS. 3B-3E present exemplary circuit path loop configurations in an inverting difference oscillator in accordance with the described embodiments.

In the figures, like reference numerals refer to the same figure elements.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Terminology

In the following description, we refer to signals being "asserted" or "deasserted." When a signal is asserted, the signal is set to a logical "1" value. In some embodiments, the logical 1 is equivalent to the voltage VDD in the system. For example, the logical 1 is a voltage of 1.2 V in a system where VDD is 1.2 V. When a signal is deasserted, the signal is set to a logical "0" value, which is typically VSS or 0 V. Note that although we describe embodiments where signals are asserted and deasserted using the indicated voltages, alternative embodiments can use different voltages.

System

Figure 1:
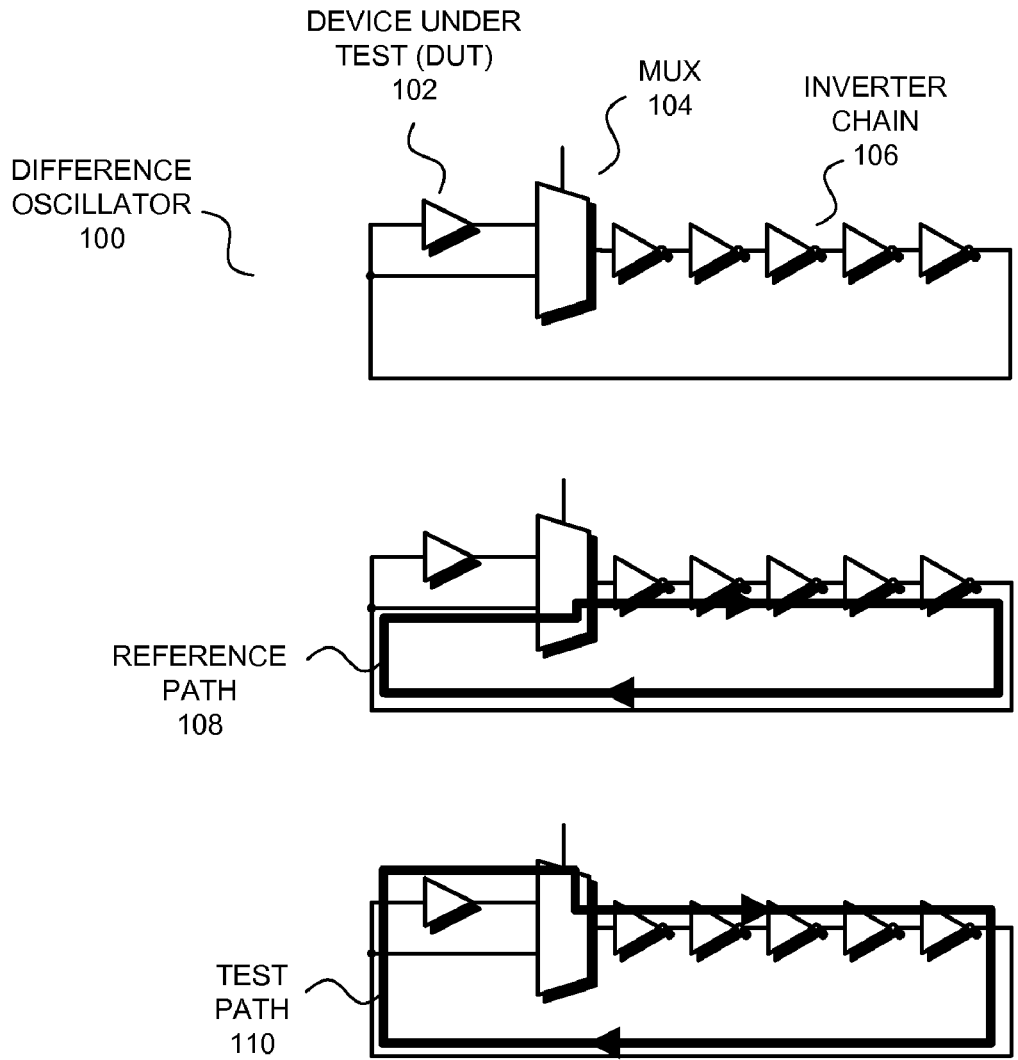
FIG. 1 presents a difference oscillator.
Figure 2:
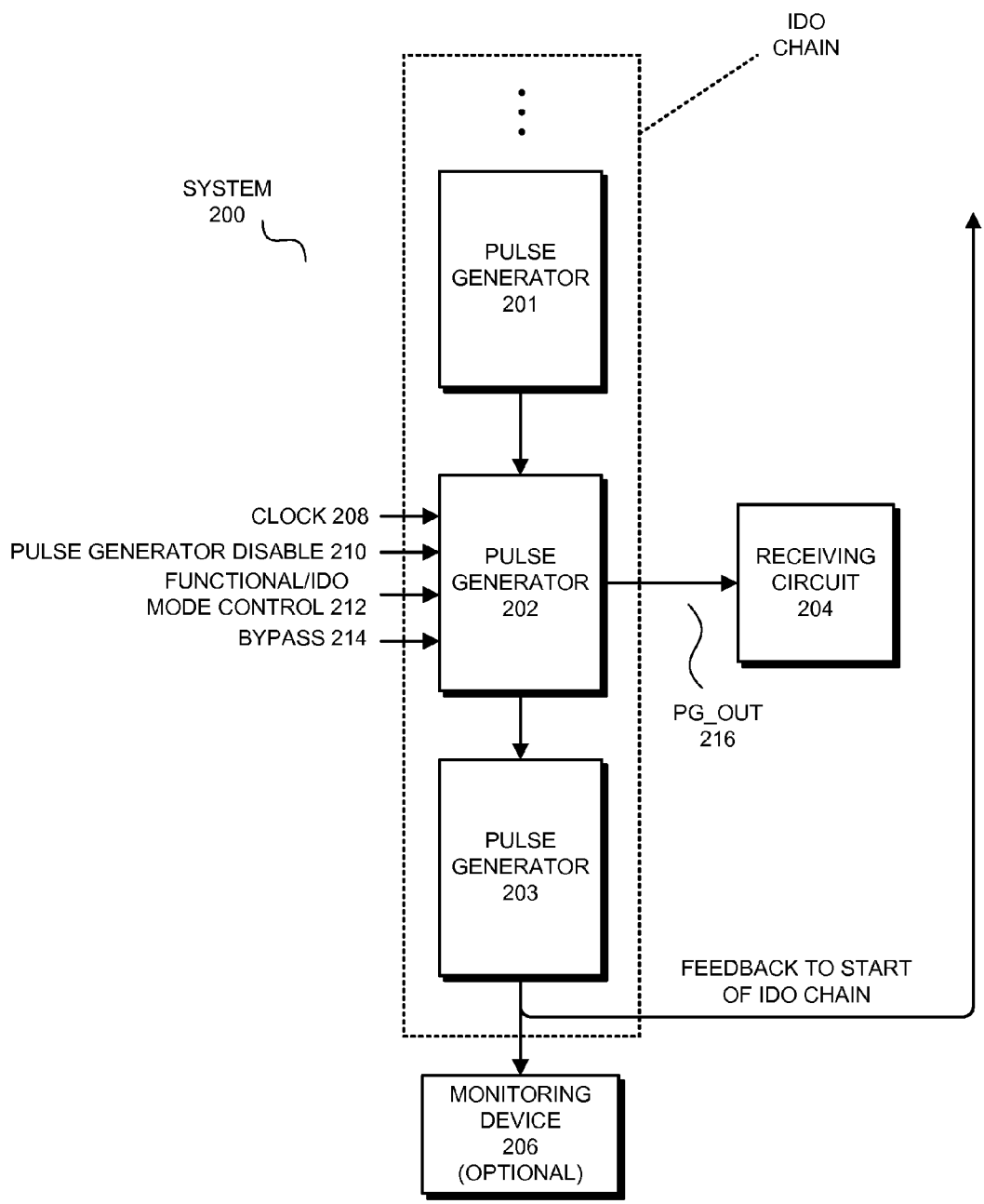
FIG. 2 presents a block diagram of a system in accordance with the described embodiments.

FIG. 2 presents a block diagram of a system 200 in accordance with the described embodiments. System 200 includes a number of pulse generators 201-203, a receiving circuit 204, and an (optional) monitoring device 206. Pulse generators 201-203 are coupled in series to enable configuring pulse generators 201-203 as part of an inverting difference oscillator (IDO).

Pulse generators 201-203 are circuits that can be configured to generate pulses. Pulse generators 201-203 can also be configured as part of an IDO (i.e., as a stage in an IDO "chain"), or can be disabled, which causes each pulse generator to output a steady signal on its output node. More specifically, pulse generators 201-203 include circuit structures that can be used to configure each pulse generator as a pulse generator, as part of the IDO, or to disable the pulse generator, depending on the state of enable inputs for the pulse generator (e.g., functional/IDO mode control 212 and pulse generator disable 210). The configuration of pulse generators 201-203 is described in more detail below.

Note that in the following description we may describe the functions of pulse generator 202 alone for clarity. However, pulse generators 201 and 203 can include similar inputs and circuit structures and can function in the same way as pulse generator 202. In addition, like pulse generator 202, pulse generators 201 and 203 can be coupled to receiving circuits (not shown). Moreover, as shown by the ellipsis in FIG. 2, in some embodiments, one or more additional pulse generators are coupled in series with pulse generators 201-203.

Receiving circuit 204 is a circuit that takes as an input the signal output by pulse generator 202. Generally, receiving circuit 204 can be any type of circuit that uses the pulse generated by pulse generator 202 as a timing signal, a control signal, a reference signal, a data signal, or for another purpose. For example, receiving circuit 204 can be, but is not limited to, one or more individual circuit elements (e.g., pulse latches, domino circuits, memory elements, control circuits, etc.), a synchronous random-access memory (SRAM) or dynamic random-access memory (DRAM), a microprocessor, a controller, an application-specific integrated circuit (ASIC).

As shown in FIG. 2, pulse generator 202 takes clock 208, pulse generator disable 210, functional/IDO mode control 212, and bypass control 214 as inputs. Clock 208 is used as a triggering signal for pulse generator 202. More specifically, a rising transition in clock 208 causes pulse generator 202 to generate a rising pulse on pg_out 216. In some embodiments, the signal on clock 208 has a periodic waveform.

Pulse generator disable 210 is a control signal that can be used to prevent pulse generator 202 from outputting any varying signal (e.g., a pulsed signal or an oscillating signal) on pg_out 216. When asserted, pulse generator disable 210 causes pulse generator 202 to output a steady signal equivalent to VDD (i.e., logical "1").

Functional/IDO mode control 212 is a control signal that can be used to configure pulse generator 202 as part of an IDO or as a pulse generator (i.e., in a "pulse generation mode"). When functional/IDO mode control 212 is asserted (e.g., is a logical "1"), pulse generator 202 is configured as a pulse generator. In contrast, when functional/IDO mode control 212 is deasserted (e.g., is a logical "0"), pulse generator 202 is configured as part of the IDO. When configured as part of the IDO, pulse generator 202 uses the output signal of the previous stage (e.g., pulse generator 201), which is itself oscillating, as an input. In addition, instead of outputting a pulse on pg_out 216, pulse generator 202 outputs an oscillating (periodic) waveform on pg_out 216. As described below, the periodic waveform output can be forwarded to the next stage in the IDO (e.g., pulse generator 203).

In some embodiments, functional/IDO mode control 212 is a global signal that is coupled to each pulse generator (i.e., pulse generators 201-203). As described above, in these embodiments, deasserting functional/IDO mode control 212 configures a selection circuit in each pulse generator to select the output from a previous pulse generator as a feedback for the pulse generator (instead of a local feedback path for the pulse generator). In addition, deasserting functional/IDO mode control 212 configures each pulse generator to pass the received signal through a set of inversions within the pulse generator. Hence, functional/IDO mode control 212 enables pulse generators 201-203 to be configured as part of a ring oscillator that can be used as part of the IDO.

Bypass control 214 is a control signal that can be used to bypass pulse generator 202 in the IDO configuration. Generally, when bypass control 214 is asserted for a given pulse generator stage (e.g., pulse generator 202), a selection circuit in the pulse generator is configured to pass an output signal from a previous pulse generator in the chain (e.g., pulse generator 201) directly to a next pulse generator in the chain (e.g., pulse generator 203) without passing the output signal through the set of inversions in the pulse generator. In these embodiments, bypass control 214 enables system 200 to control the number of stages in the ring oscillator of the IDO.

Monitoring device 206 is a device that takes the signal output by the chain of pulse generators as an input. In some embodiments, monitoring device 206 measures the signal output by the chain of pulse generators and uses the measured signal to help determine a delay of a selected pulse generator in the chain of pulse generators. Determining the delay of a selected pulse generator in the chain of pulse generators is described in more detail below.

Monitoring device 206 can be coupled to a display device, a computer-readable storage medium, or another device. Upon determining the delay of a given pulse generator, monitoring device 206 can then display the delay on the display device or write the delay to the computer-readable storage medium. Alternatively, in embodiments where system 200 is a computer system, monitoring device 206 could forward the determined delay to an application or process within system 200 for handling.

Although shown as part of system 200 in FIG. 2, in some embodiments, monitoring device 206 is not included in a device that includes pulse generator 202 and receiving circuit 204. In other words, monitoring device 206 is in a separate device. For example, pulse generator 202 and receiving circuit 204 can be included on a first integrated circuit chip (e.g., microprocessor, controller, ASIC, etc.), while monitoring device 206 is on a separate integrated circuit chip or device that is coupled to the first integrated circuit chip. In these embodiments, the number of stages in the chain of pulse generators can be selected so that a frequency of the oscillating signal of the IDO is slow enough to enable monitoring device 206 to receive the oscillating signal off-chip and/or accurately measure the oscillating signal. For example, 80, 100, 200, or another number of pulse generators can be coupled together to form an IDO with a desired oscillation frequency.

System 200 can be incorporated into many different types of electronic devices. For example, system 200 can be part of a desktop computer, a laptop computer, a server, a media player, an appliance, a cellular phone, a piece of testing equipment, a network appliance, a personal digital assistant (PDA), a hybrid device (i.e., a "smart phone") or another electronic device.

In some embodiments, some or all of system 200 is fabricated using one or more integrated circuit chips. In these embodiments, the pulsed or oscillating signals generated within a given integrated circuit chip can be passed off-chip to other integrated circuit chips for handling, forwarding, use, modification, or to be measured. For example, in some embodiments, pulse generator 202 and receiving circuit 204 are fabricated in one integrated circuit chip, while monitoring device 206 is fabricated in another. In these embodiments, typical off-chip communication structures (i.e., traces in a circuit board, bonding pads, etc.) can be used for communicating between the integrated circuit chips.

Although we use specific components to describe system 200, in alternative embodiments different components may be present in system 200. For example, system 200 may include one or more additional receiving circuits 204 for pulse generator 202. In addition, although we show the input signals to pulse generator 202 as including a number of signals, in alternative embodiments, more or fewer signals can be used as inputs for pulse generator 202.

In some embodiments, pulse generator 202 can be used without other pulse generators (e.g., pulse generators 201 and 203). For example, pulse generator 202 can be used in an IDO where one or more other stages are implemented using different types of circuit elements, such as simple or complex logic gates. In addition, pulse generator 202 can be used in other types of circuits.

Inverting Difference Oscillator

FIG. 3A presents an inverting difference oscillator 300 in accordance with the described embodiments. Inverting difference oscillator 300 is a configurable ring oscillator that enables the determination of the delay of a device under test (DUT) 302. As described in detail below, a circuit path in inverting difference oscillator 300 loops from DUT 302, through a configurable arrangement of inverter chains and bypass paths, and back to DUT 302. Generally, to determine the delay through DUT 302, a series of different mathematical expressions is generated using delays measured through corresponding different configurations of the circuit path loop. Then, using these expressions as inputs, mathematical techniques can be used to find the delay through the DUT.

Note that the device under test 302 in inverting difference oscillator 300 is an inverting device. Unlike existing difference oscillators, which are only functional for non-inverting devices, the described embodiments can test inverting devices. (However, the described embodiments can also compute the delays for non-inverting devices given, a proper arrangement of the inverter chains in inverting difference oscillator 300 using the technique described below.)

As shown in FIG. 3A, inverting difference oscillator 300 includes device under test (DUT) 302, multiplexers (MUXes) 304, 308, and 312, inverter chains 306 and 310, and delay devices 314. DUT 302 is a device for which the delay (i.e., the propagation time for signals across the device) is to be measured. MUXes 304, 308, and 312 are selection circuits that enable the configuration of different circuit paths through inverting difference oscillator 300.

We generally refer to a given circuit element path and bypass path, and the selection circuit to which the paths are coupled as a "stage" in inverting difference oscillator 300. For example, DUT 302, bypass path 316, and MUX 304 form one stage, and inverter chain 306, bypass path 318, and MUX 308 form another.

Inverter chains 306 and 310 are reference inverting stages that can be used to configure the number of inversions in the loop for inverting difference oscillator 300 (note that we interchangeably refer to inverter chain 306 as "reference A" and to inverter chain 310 as "reference B"). Although we present an embodiment where each inverter chain 306 and 310 includes three inversions, in alternative embodiments a different number of inversions can be used, including a different number of inversions between the inverter chains. In addition, although only two inverter chains are shown, alternative embodiments use a different number of inverter chains. Moreover, although simple inverters are shown for clarity, any inverting logic gate or functional block can be used, such as an inverting logic gate/functional block, a non-inverting logic gate/functional block, a combination of inverting and non-inverting logic gates/functional blocks, etc.

Delay 314 includes a series of devices that are configured to slow the propagation of signals around the circuit path loop in inverting difference oscillator 300. In some embodiments, the propagation of a signal around the circuit path loop can be slowed using delay 314 to reduce the oscillation frequency of inverting difference oscillator 300. In some embodiments, the frequency of oscillation is selected in accordance with the expected delay of DUT 302. If DUT 302 has a low delay (e.g., tens or hundreds of picoseconds), the frequency of oscillation can be left high; otherwise, if DUT 302 has a high delay, the frequency of oscillation can be reduced. Generally, a higher oscillating frequency can enable these embodiments to more accurately determine the delay for DUTs with lower delay times. Note that additional inverter chains coupled to MUXes (not shown) can also be used to reduce the oscillating frequency of the ring oscillator.

As described generally above, when generating each of the expressions that is used to determine the delay of DUT 302, a corresponding path around the circuit path loop is selected and MUXes 304, 308, and 312 are set to configure inverting difference oscillator 300 accordingly. Inverting difference oscillator 300 is then operated to generate an oscillating output signal and the frequency of the oscillation of the output signal is measured. From the measured frequency, a period of oscillation can be determined, and from the determined period, a delay around the circuit path loop can be computed. The computed delay can then be placed in a mathematical expression that relates the delay through the inverting difference oscillator to the circuit elements present in the corresponding circuit path loop. The mathematical expressions for the configurations of the circuit path loop can then be used to determine the delay through DUT 302.

Figure 3E:
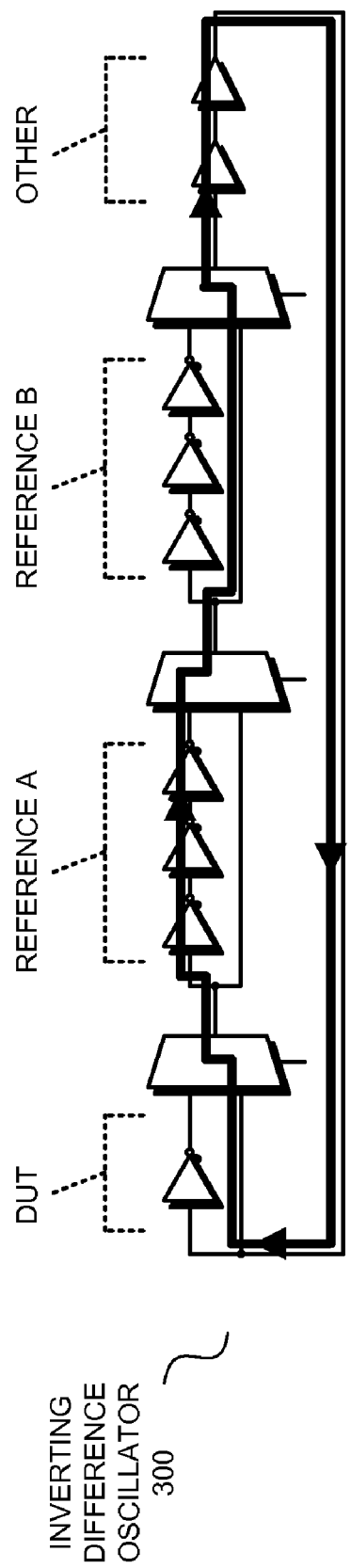

FIGS. 3B-3E present exemplary circuit path loop configurations in an inverting difference oscillator in accordance with the described embodiments. The path around the circuit path loop in each configuration is shown using a heavy black line in FIGS. 3B-3E. Although inverting difference oscillator 300 in FIG. 3B is the same as inverting difference oscillator 300 shown in FIG. 3A, for clarity in describing the determination of the delay for DUT 302, groups of circuit elements are labeled more simply using "DUT," "reference A," etc., which generally represent the delay through the indicated circuit element paths. Unlabeled circuit elements may be described using the identification numbers shown in FIG. 3A.

As shown in FIG. 3B, MUX 304 is set to forward the output from DUT 302, and MUXes 308 and 312 are set to forward the outputs from circuit paths reference A and reference B, respectively. Hence, the circuit path loop configuration shown in FIG. 3B causes a signal propagating around inverting difference oscillator 300 to propagate through DUT, reference A, reference B, and other. The following expression can be used to express the delay in this configuration of the circuit path loop:

$$DLY1 = DUT + REF\_A + REF\_B + OTHER \quad (1)$$

where the expression equates the delay of the path (i.e., DLY1) to the sum of the delays of the circuit elements that are present in the path (i.e., the DUT, etc.).

As shown in FIG. 3C, MUX 304 is set to bypass DUT, MUX 308 is set to bypass reference A (i.e., to forward the bypass path for the stage), and MUX 312 is set to forward the output from reference B. Hence, the circuit path loop configuration shown in FIG. 3C causes a signal propagating around inverting difference oscillator 300 to bypass DUT and reference A, but to propagate through reference B and other. The following expression can be used to express the delay in this configuration of the circuit path loop:

$$DLY2 = 0 + 0 + REF\_B + OTHER \quad (2)$$

As shown in FIG. 3D, MUX 304 is set to forward the output from DUT, MUX 308 is set to bypass reference A, and MUX 312 is set to bypass reference B. Hence, the circuit path loop configuration shown in FIG. 3D causes a signal propagating around inverting difference oscillator 300 to propagate through DUT, bypass reference A and reference B, and propagate through other. The following expression can be used to express the delay in this configuration of the circuit path loop:

$$DLY3 = DUT + 0 + 0 + OTHER \quad (3)$$

As shown in FIG. 3E, MUX 304 is set to bypass DUT, MUX 308 is set forward the output from reference A, and MUX 312 is set to bypass reference B. Hence, the circuit path loop configuration shown in FIG. 3E causes a signal propagating around inverting difference oscillator 300 to bypass DUT, propagate through reference A, bypass reference B, and propagate through other. The following expression can be used to express the delay in this configuration of the circuit path loop:

$$DLY4 = 0 + REF\_A + 0 + OTHER \quad (4)$$

In the described embodiments, expressions 1-4 can then be used to solve for the delay of the DUT as follows:

$$DLY1 - DLY2 = (DUT + REF\_A + REF\_B + OTHER) - (0 + 0 + REF\_B + OTHER), \text{ simplified: } DLY1 - DLY2 = DUT + REF\_A \quad (5)$$

$$DLY3 - DLY4 = (DUT + 0 + 0 + OTHER) - (0 + REF\_A + 0 + OTHER), \text{ simplified: } DLY3 - DLY4 = DUT - REF\_A \quad (6)$$

Equation (5)+Equation (6)

$$(DLY\_1 - DLY\_2) + (DLY\_3 - DLY\_4) = (DUT + REF\_A) + (DUT - REF\_A), \text{ simplified: } (DLY\_1 - DLY\_$$

$$2)+(DLY\_3-DLY\_4)=2*DUT, \text{ and}: DUT= ((DLY\_1-DLY\_2)+(DLY\_3-DLY\_4))/2 \quad (7)$$

In addition, in these embodiments, expressions 1-4 can be used in a similar way to solve for the delay of REF_A as follows:

Equation (5)-Equation (6)

$$(DLY\_1-DLY\_2)-(DLY\_3-DLY\_4)=(DUT+REF\_A)-(DUT-REF\_A), \text{ simplified}: (DLY\_1-DLY\_2)-(DLY\_3-DLY\_4)=2*REF\_A, \text{ and}: REF\_A= ((DLY\_1-DLY\_2)-(DLY\_3-DLY\_4))/2 \quad (8)$$

Given expressions 7-8, with REF_A known, further $DUT_n$ in a $ring_n$ (i.e., in an inverting difference oscillator) with n number of devices under test can be measured similarly to DLY_2:

$$DUT_n = DLY1_n - DLY2_n - REF\_A \quad (9)$$

Some embodiments can include a microprocessor with general purpose circuits, or one or more ASICs or programmable-logic devices that can be configured to perform the computation. In some embodiments, the general purpose circuits can execute program code, firmware, or other code to configure the general purpose circuits to perform the computation.

As described above, the result of the computation can be conveyed to a user, an application, a test circuit, or another entity, or can be stored on a computer-readable storage medium.

Process for Using an Inverting Difference Oscillator

Figure 4:
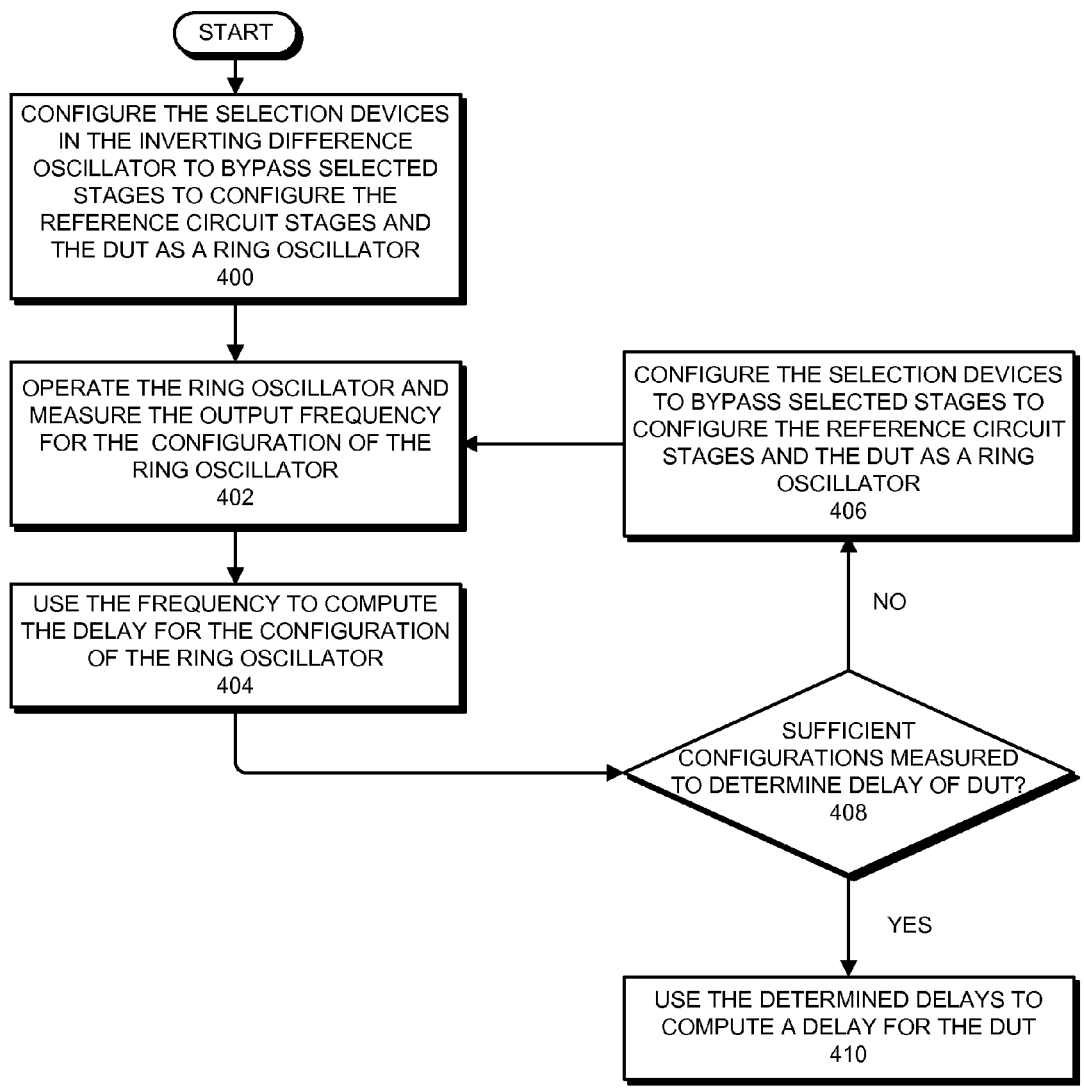
FIG. 4 presents a flowchart illustrating a process for computing a delay of a device under test using an inverting difference oscillator in accordance with the described embodiments.

FIG. 4 presents a flowchart illustrating a process for computing a delay of a device under test using an IDO in accordance with the described embodiments. The operations in the process shown in FIG. 4 are performed on an IDO with a similar structure to the IDO shown in FIG. 3A. More specifically, the operations in the process are performed on an IDO that includes a DUT stage and N reference stages with a selection device (e.g., a MUX) coupled between each stage.

The process starts when system 200 configures the selection devices in the IDO to bypass selected stages to configure the reference circuit stages and the DUT as a ring oscillator (step 400). For example, using the circuit shown in FIGS. 3A-3E, the IDO can be configured as shown in one of FIGS. 3B-3E, or can be configured in another way. Note that bypassing selected stages can involve bypassing none of the stages in the IDO.

System 200 then operates the ring oscillator and measures the output frequency for the configuration of the ring oscillator (step 402). For example, in some embodiments, a monitoring device (e.g., monitoring device 206) can receive an oscillating signal from the IDO and count the number of rising or falling edges in the oscillating signal in a given period of time to determine the frequency of the oscillating signal. Alternative embodiments can use different techniques for determining the frequency of the oscillating signal (e.g., high or low peaks, zero-crossings, etc.).

System 200 then uses the frequency to compute the delay for the configuration of the ring oscillator (step 404). The period of the ring oscillator is twice the delay of the ring oscillator. Hence, determining the delay involves converting the frequency to a period and then dividing the period in half.

System 200 then determines if sufficient configurations of the IDO have been measured to determine the delay of the DUT (step 408). For example, assuming system 200 uses the technique described above with respect to equations 1-8 to compute the delay of the DUT, system 200 can determine if enough configurations have been measured to perform the computations.

If not, system 200 configures the selection devices to bypass selected stages to configure the reference circuit stages and the DUT as a ring oscillator (step 406). When performing this operation, system 200 can select a different configuration for the reference circuit stages than was previously used to compute a delay. For example, assuming a case where the IDO is similar to the IDO in FIGS. 3A-3E, and system 200 has already computed the delay for the configurations shown in FIGS. 3B and 3D, system 200 can use the selection devices to configure the inverting difference oscillator in an arrangement such as the configurations shown in FIG. 3C, FIG. 3E, or another configuration. System 200 then returns to step 402 to operate the ring oscillator and measure the output frequency.

Otherwise, if sufficient configurations have been measured (step 408), system 200 uses the determined delays to compute a delay for the DUT (step 410). In some embodiments, determining the delay involves performing the operations described above with respect to equations 1-8. In alternative embodiments, different techniques can be used.

Pulse Generator

Figure 5A:
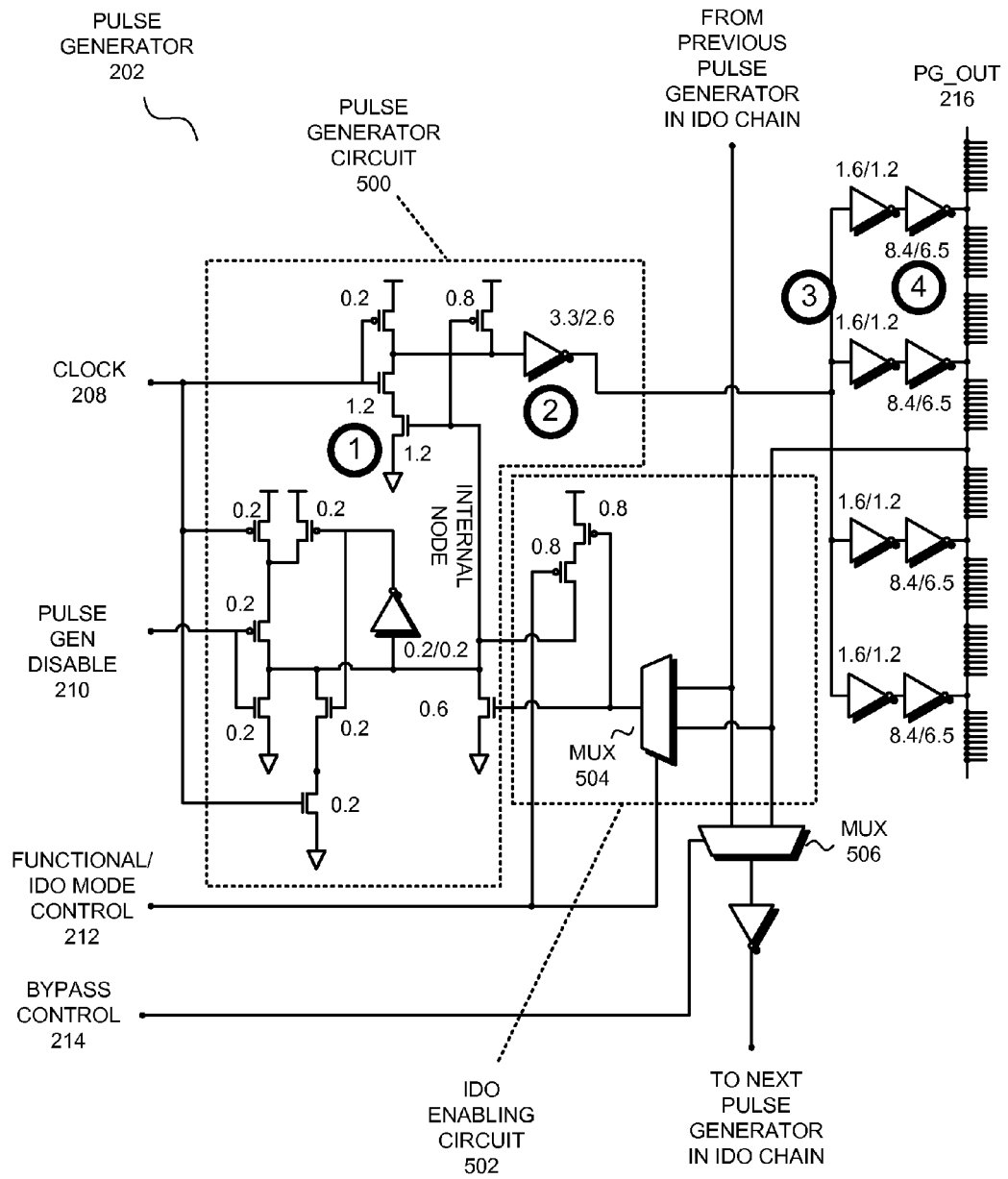
FIG. 5A presents a schematic view of a pulse generator in accordance with the described embodiments.

FIG. 5A presents a schematic view of a pulse generator 202 in accordance with the described embodiments. Pulse generator 202 includes pulse generator circuit 500 and IDO enabling circuit 502. Generally, pulse generator circuit 500 generates pulses on output pg_out 216 when IDO enabling circuit 502 is disabled. In contrast, pulse generator 202 is configured as part of an IDO when IDO enabling circuit 502 is enabled. As described above with respect to FIG. 2, pulse generator 202 takes clock 208, pulse generator disable 210, functional/IDO mode control 212, and bypass control 214 as inputs.

As shown in FIG. 5A, the output of MUX 504 is coupled to the gate connection of an n-type metal-oxide-semiconductor field-effect (NMOS) transistor in pulse generator circuit 500 and the top p-type metal-oxide-semiconductor field-effect (PMOS) transistor in IDO enabling circuit 502. Functional/IDO mode control 212 is coupled to the bottom PMOS transistor in IDO enabling circuit 502 and to the select input of MUX 504.

When functional/IDO mode control 212 is asserted, the bottom PMOS transistor in IDO enabling circuit 502 is shut off, thereby preventing the top PMOS transistor (for which the gate connection is coupled to the output of MUX 504) from affecting the value on the internal node of pulse generator circuit 500. This leaves the NMOS transistor as the only transistor coupled to the output of MUX 504 that can affect the value on the internal node of pulse generator circuit 500. In addition, when functional/IDO mode control 212 is asserted, MUX 504 is configured to forward a signal from a feedback path for pulse generator 202 to the NMOS transistor in pulse generator circuit 500. In this configuration, pulse generator circuit 500 generates pulses on pg_out 216 in response to rising edges on clock 208.

In contrast, when functional/IDO mode control 212 is deasserted, the bottom PMOS transistor in IDO enabling circuit 502 is enabled. When this PMOS transistor is enabled, the combination of the top PMOS transistor in IDO enabling circuit 502 and the NMOS transistor in pulse generator circuit 500 form an inversion in the feedback path of pulse generator circuit 500. In addition, when functional/IDO mode control 212 is deasserted, MUX 504 is configured to forward a signal received from a previous pulse generator to the gate connections of the NMOS transistor in pulse generator circuit 500 and the top PMOS transistor in IDO enabling circuit 502, instead of forwarding pulse generator 202's feedback path. This inversion, in combination with the other inversions in pulse generator circuit 500 (see e.g., encircled numbers 1-4 in FIG. 4A), and any other inverting devices in an IDO chain to which pulse generator 202 is coupled, forms a ring oscillator within the IDO. Ring oscillators, as is well known in the art, are circuits with odd numbers of inverters that generate oscillating waveforms.

In some embodiments, when functional/IDO mode control 212 is asserted (i.e., when pulse generator is configured as part of the IDO), clock 108 is held in a logical high state (i.e., held at VDD). In other words, in these embodiments, clock 108 does not oscillate when pulse generator is configured as part of the IDO.

Figure 5B:
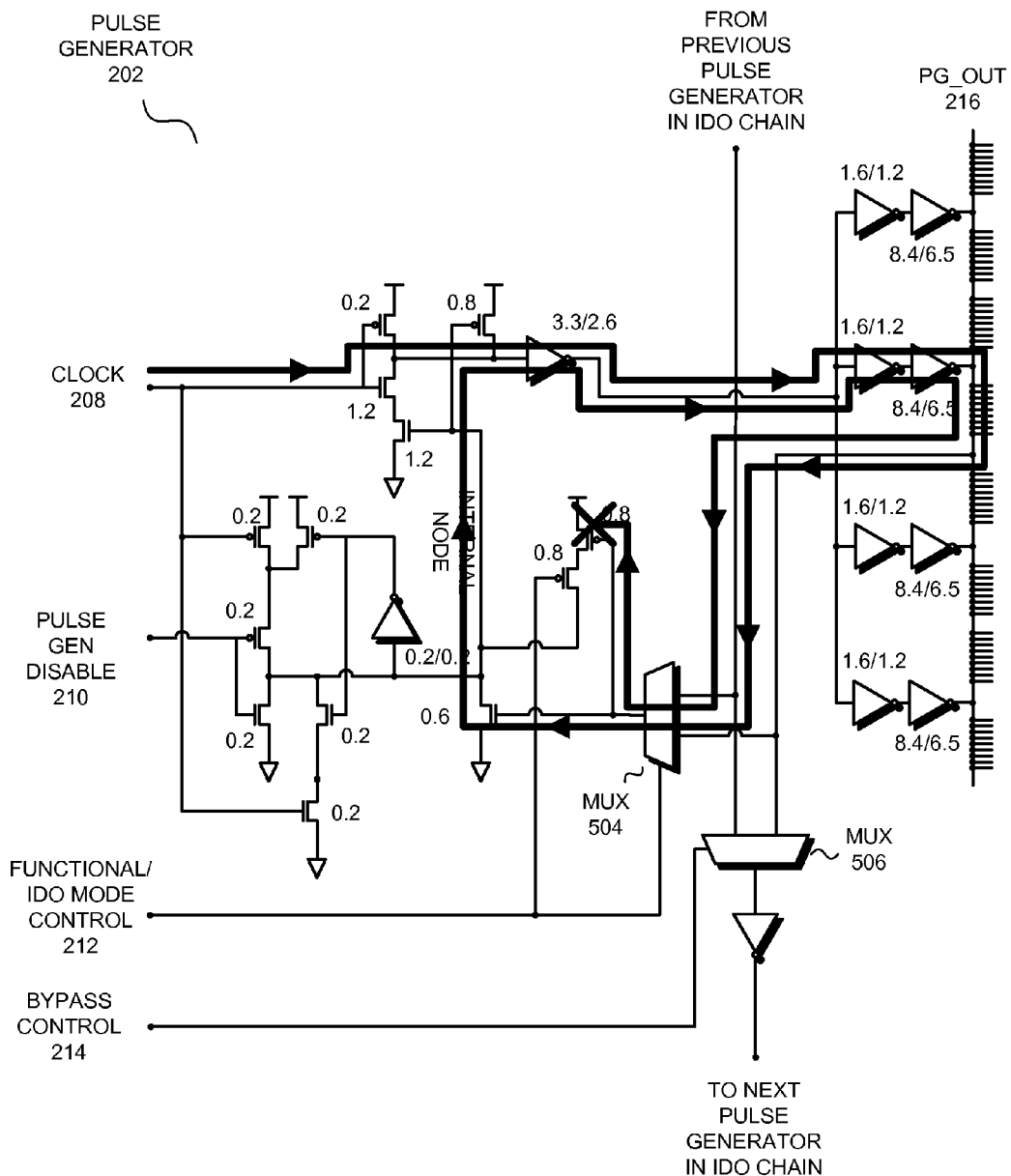
FIGS. 5B-5D provide schematic views of circuit paths in a pulse generator in accordance with the described embodiments.
Figure 5C:
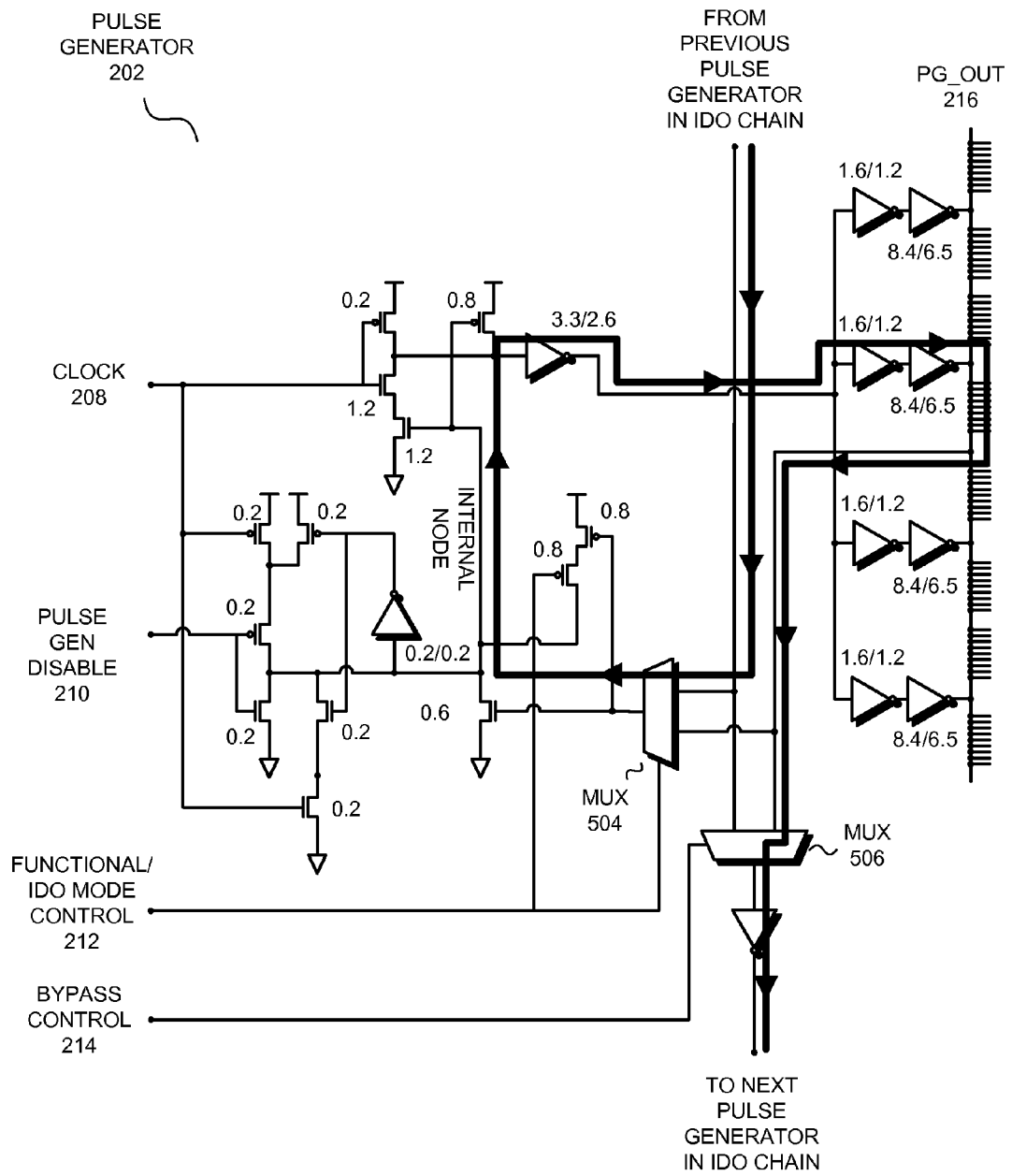
Figure 5D:
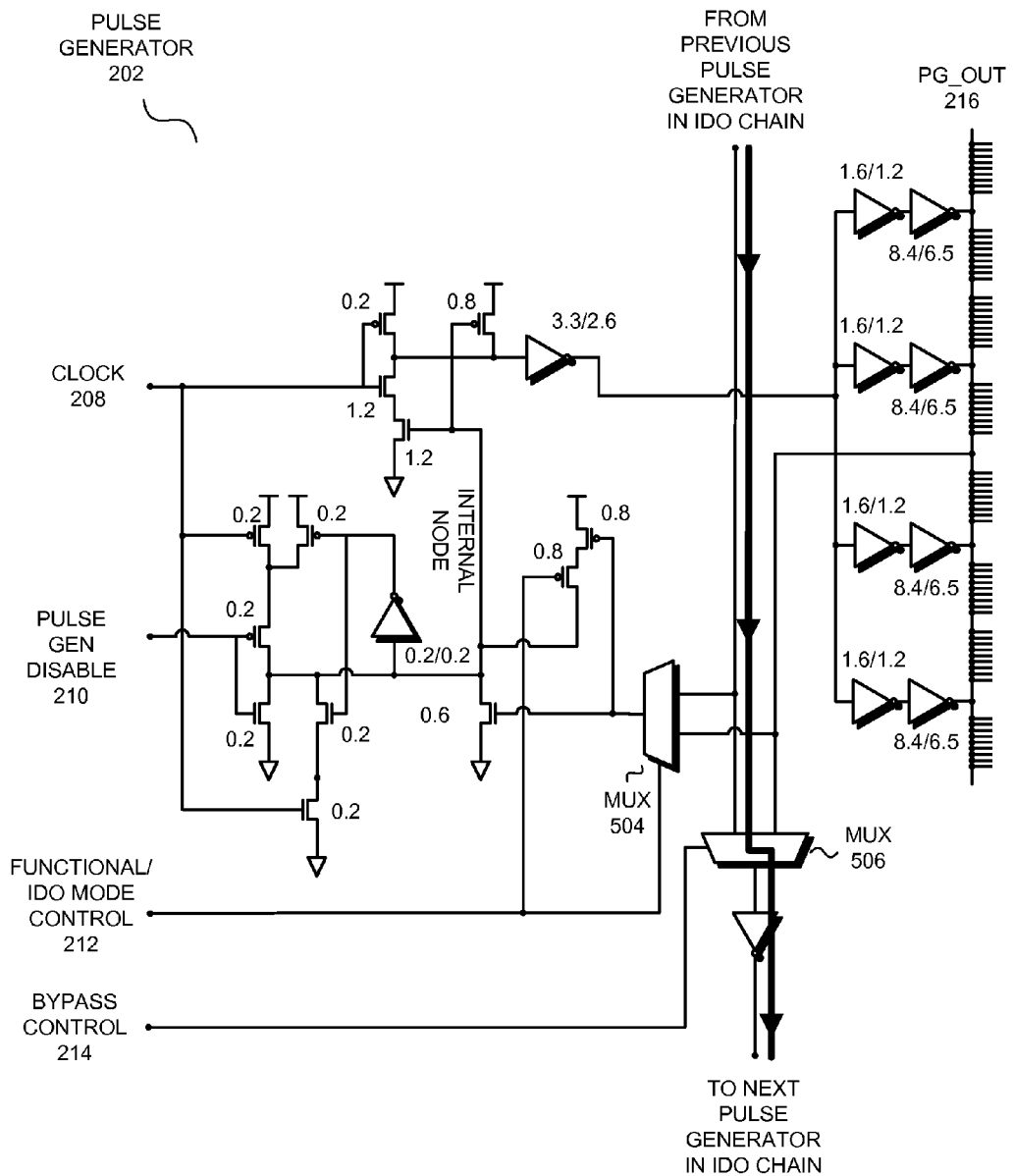

FIGS. 5B-5D present exemplary circuit paths within pulse generator 202 that are taken according to whether functional/IDO mode control 212 and bypass control 214 are asserted and/or deasserted. More specifically, FIG. 5B shows an exemplary circuit path taken when functional/IDO mode control 212 is asserted (in this case, the asserted or deasserted state of bypass control 214 does not matter), FIG. 5C shows an exemplary circuit path taken when functional/IDO mode control 212 is deasserted and bypass control 214 is deasserted, and FIG. 5D shows an exemplary circuit path taken when functional/IDO mode control 212 is deasserted and bypass control 214 is asserted.

In the first example, the functional/IDO mode control is asserted, disabling the PMOS transistor in IDO enabling circuit 502 and leaving only the NMOS transistor that is coupled to the output of MUX 504 able to affect the internal node in pulse generator circuit 500. As shown in FIG. 5B, for this configuration, the path through the circuit starts at a rising edge of clock 208, causes pg_out 216 to rise, and then propagates once around the internal feedback path, causing output pg_out 216 to fall, thereby generating a pulse. However, when the fallen pg_out 216 begins to propagate back into the feedback circuit, the propagation is stopped at the PMOS device in IDO enabling circuit 502 (as shown by the "X" in FIG. 5B), because functional/IDO mode control 212 is deasserted, thereby disabling the PMOS transistor stack in IDO enabling circuit 502. Another pulse is therefore not generated until another rising edge occurs on clock 208.

In the second example, both functional/IDO mode control 212 and bypass control 214 are deasserted. When functional/IDO mode control 212 is deasserted, MUX 504 forwards a signal from a previous pulse generator in the IDO chain into pulse generator circuit 500. In addition, the top PMOS transistor in IDO enabling circuit 502, in combination with the NMOS transistor in pulse generator circuit 500 coupled to the output of MUX 504, form an inverter that is included as part of a ring oscillator formed by pulse generator 202 and other pulse generators in an IDO. As shown in FIG. 5C, in this configuration, the signal feeds from the previous pulse generator in the IDO chain, through MUX 504 and into the inversion formed by the PMOS transistors in the IDO enabling circuit in combination with the NMOS transistor. The signal then feeds through the remaining inversions (inversions 1-4 in FIG. 5A) in pulse generator circuit 500 and to pg_out 216. From pg_out 216, the signal feeds to MUX 506. Because bypass control 214 is deasserted, the signal is forwarded from MUX 506 to the next pulse generator in the IDO chain.

In the third example, functional/IDO mode control 212 is deasserted, but bypass control 214 is asserted. In this case, as shown in FIG. 5D, the signal may propagate within pulse generator 202 as shown in FIG. 5C, but instead of forwarding the signal from within pulse generator 202, bypass control 214 configures MUX 506 to forward the signal from the previous pulse generator in the IDO chain directly to the next pulse generator in the IDO chain. By configuring pulse generator 202 in this way, bypass control 214 enables system 200 (or another controlling device) to control the number of inverters in the IDO by adding or removing the internal inversions in a given pulse generator to the IDO chain.

Configuring Pulse Generators as an Inverting Difference Oscillator

As described above with respect to FIG. 2, in some embodiments, pulse generators 201-203 can be configured as an IDO by deasserting a global functional/IDO mode control 212. In some of these embodiments, the IDO formed from pulse generators 201-203 can be arranged similarly to the IDO shown in FIG. 3A. In this arrangement, the inverting DUT 302 and inverter chains 306 and 310 can be formed from the internal inversions in pulse generators 201-203, and MUXes 304, 308, and 312 in the IDO can be formed from MUXes 506 in pulse generators 201-203. (Note that in some embodiments one or more of the DUT, the inverter chains, and the MUXes can be formed from other circuit elements.)

For example, assuming that pulse generators 201-203 appear in the order 201-203 from left to right in the IDO shown in FIG. 3A, the inverting DUT 302 is replaced by the internal inversions in pulse generator 201 (of which there are five) and MUX 304 is replaced by MUX 506 in pulse generator 201. Inverter chain 306 and MUX 308 are replaced by the internal inversions and MUX 506 in pulse generator 202, respectively, and inverter chain 310 and MUX 312 are replaced by the internal inversions and MUX 506 in pulse generator 203, respectively.

Although there are different numbers of inversions in pulse generators 201-203 than are shown in DUT 302 or inverter chains 306 and 310 in FIG. 3A, the function of the circuit does not change when replacing DUT 302 or inverter chains 306 and 310 in FIG. 3A with the internal inversions in pulse generators 201-203. This is true because the pulse generators are inverting (i.e., have an odd number of internal inversions), in the same way as the single inversion in DUT 302 and the three inversions in inverter chains 306 and 310. Consequently, an IDO can function as a ring oscillator despite the use of pulse generators 201-203 as the DUT and inverter chains.

Figure 6:
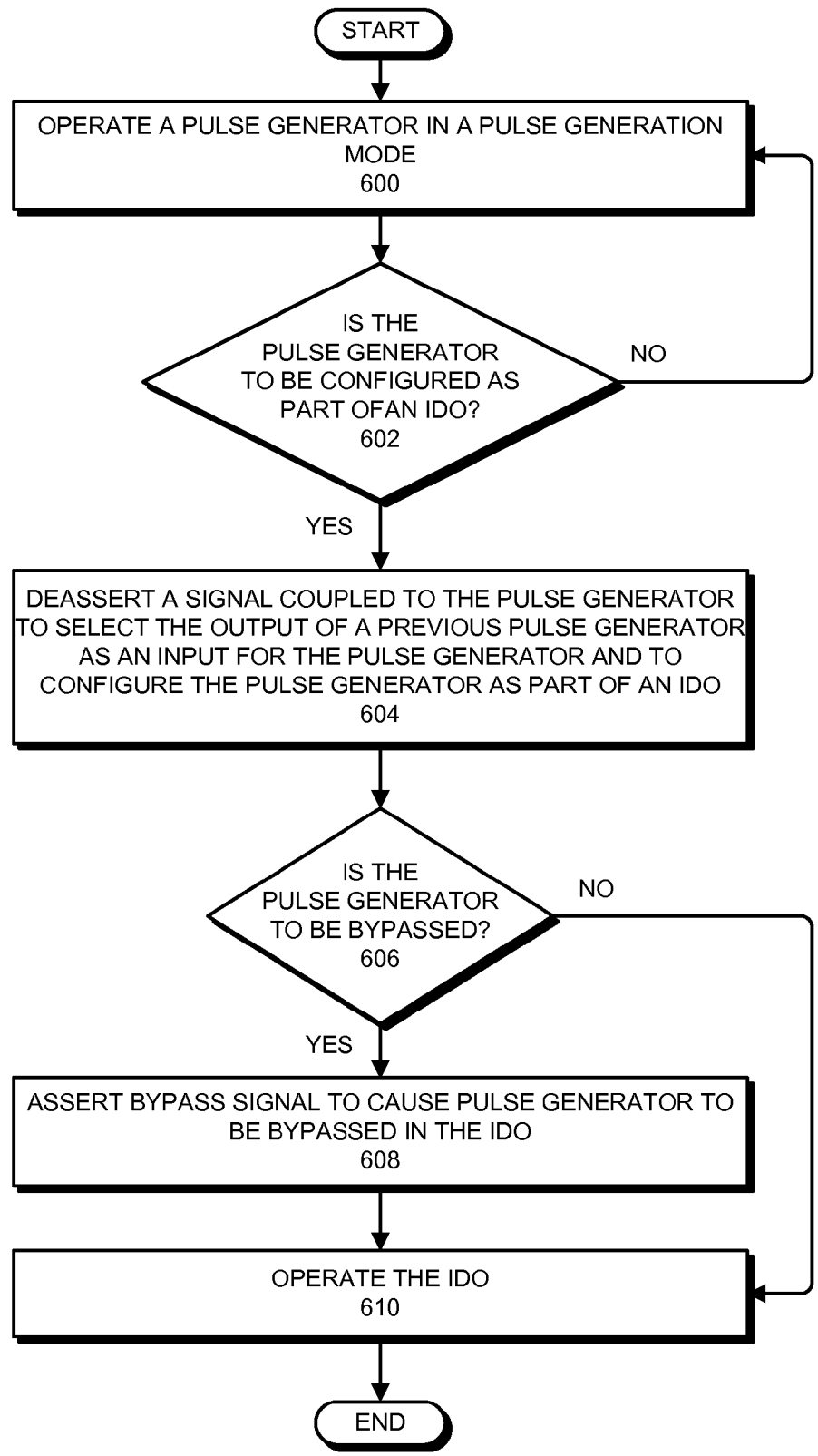
FIG. 6 presents a flowchart illustrating a process for configuring a pulse generator coupled to one or more other pulse generators as an inverting difference oscillator in accordance with the described embodiments.

FIG. 6 presents a flowchart illustrating a process for configuring a pulse generator (e.g., pulse generator 202) coupled to one or more other pulse generators (e.g., pulse generators 201 and 203) as an IDO in accordance with the described embodiments. Note that this process is being described for one pulse generator, but each pulse generator in the IDO chain can undergo a similar configuration process. For the purposes of illustration, we describe a circuit similar to the circuit shown in FIG. 2, where pulse generators 201-203 are coupled in series, which can be functionally equivalent to the figures shown in FIG. 3A-3E. Although we use a particular arrangement of circuit elements to present the functions of the described embodiments, other arrangements of pulse generators, or other circuit elements (e.g., logic gates, etc.) may be used.

The process starts with system 200 operating pulse generator 202 in a pulse generation mode (step 600). In the pulse generation mode, the functional/IDO mode control 212 signal is asserted, preventing the top PMOS transistor in IDO enabling circuit 502 (in combination with the NMOS transistor coupled to the output of MUX 504) from forming a full inversion on the output of MUX 504. In addition, MUX 504 is set to forward a feedback path into pulse generator circuit 500. Hence, pulse generator 202 outputs pulses on pg_out 216 (using the circuit path shown in FIG. 5B).

System 200 then determines whether pulse generator 202 is to be configured as part of an IDO (step 602). More specifically, system 200 determines whether series-coupled pulse generators 201-203 are each to be configured as a portion of a configurable ring oscillator in an IDO chain. If not, system 200 continues to operate pulse generator 202 in the pulse generation mode (step 600).

Otherwise, system 200 deasserts the functional/IDO mode control 212 signal to select the output of a previous pulse generator (i.e., pulse generator 201) as an input for the pulse generator and to configure the pulse generator as part of an IDO chain (step 604). More specifically, deasserting functional/IDO mode control 212 causes MUX 504 to forward the output of pulse generator 201 into pulse generator circuit 500. In addition, deasserting functional/IDO mode control 212 unblocks the PMOS transistor coupled to the output of MUX 504 to configure the NMOS transistor and PMOS transistor coupled to the output of MUX 504 as an inverter, causing pulse generator 202 to use the circuit path shown in FIG. 5C.

System 200 then determines if pulse generator 202 is to be bypassed (step 606). For example, if the IDO is to be configured without the inversions in pulse generator 202, system 200 can determine that pulse generator 202 is to be bypassed. If pulse generator 202 is to be bypassed, system 200 asserts the bypass signal to cause pulse generator 202 to be bypassed in the IDO chain (step 608). Recall that bypassing pulse generator 202 causes the oscillating signal to be passed from pulse generator 201 directly through pulse generator 202, and to pulse generator 203, as is shown by the circuit path in FIG. 5D. Hence, pulse generator 202 has no effect on the oscillating state of the bypassed signal (i.e., does not cause a delay in the bypassed signal).

System 200 then operates the IDO (step 610). Note that this can involve operating the IDO with or without pulse generator 202, depending on the state of the bypass control 214 signal for pulse generator 202.

Figure 7:
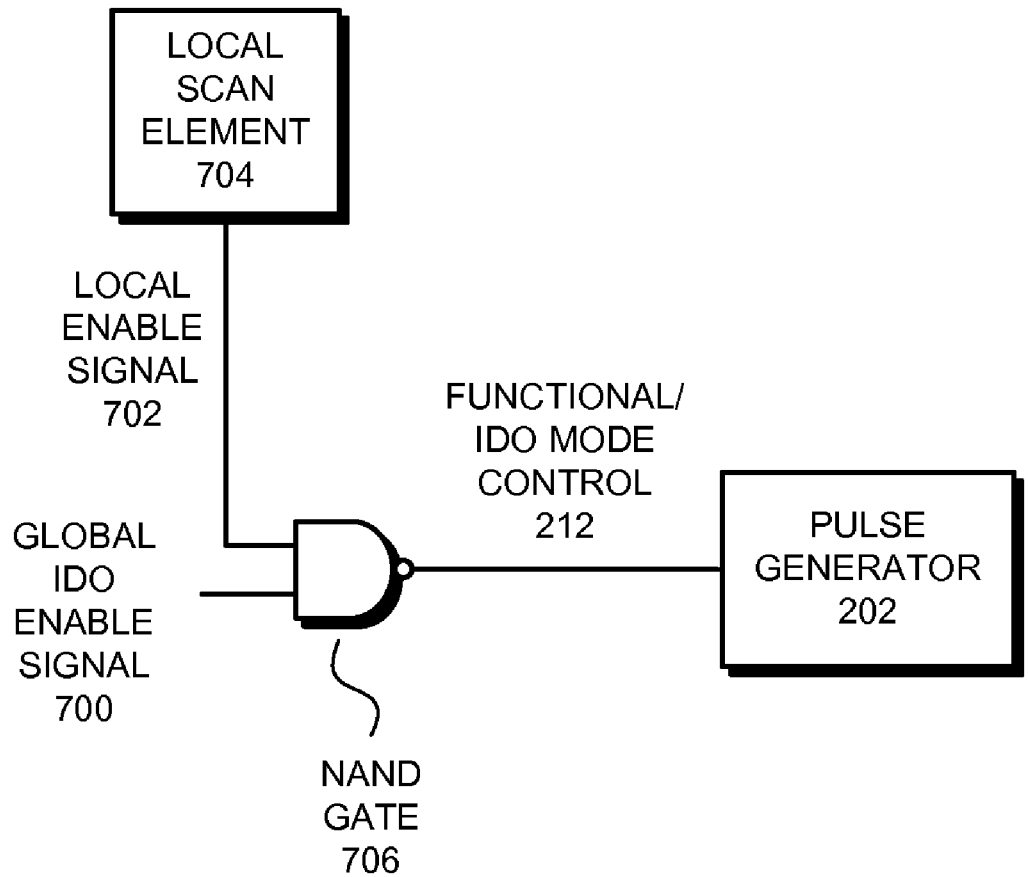
FIG. 7 presents a pulse generator 202 in accordance with some embodiments

FIG. 7 presents a pulse generator 202 in accordance with some embodiments. For clarity, in FIG. 7, pulse generator 202 is shown as a simplified version of pulse generator circuit 202 shown in FIG. 2 (i.e., FIG. 7 does not show some of the inputs to pulse generator 202).

As shown in FIG. 7, the functional/IDO mode control 212 input to pulse generator 202 can be formed by NANDing a global IDO enable signal 700 with a local enable signal 702 from a local scan latch 704 using NAND gate 706. In these embodiments, when global IDO enable signal 700 and/or local enable signal 702 is deasserted, functional/IDO mode control 212 is held in an asserted state, preventing the configuration of pulse generator 102 as an oscillator (i.e., so that the pulse generator circuit is configured in a pulse generation mode, and none of a set of internal inverting circuit elements in the pulse generator circuit is included as inverting circuit elements on the circuit element path in the stage). However, when global IDO enable signal 700 and local enable signal 702 are both asserted, NAND 706 gate is configured to output a deasserted signal on the functional/IDO mode control 212 input to configure pulse generator 202 so that the set of internal inverting circuit elements are included as inverting circuit elements in the circuit element path in the stage (i.e., as a stage in an inverting difference oscillator such as in FIGS. 2-3E).

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An inverting difference oscillator circuit, comprising:
N stages, wherein each stage includes:
a circuit element path that includes at least one inverting circuit element;
a bypass path; and
a selection circuit, wherein one input of the selection circuit is coupled to the circuit element path and another input of the selection circuit is coupled to the bypass path, and wherein an output of the selection circuit is coupled to the bypass path and to the circuit element path in a next stage; and
wherein an output of a selection circuit in a last stage is coupled to the bypass path and to the circuit element path that are coupled to the inputs of the selection circuit in a first stage to form a circuit path loop; and
N control signals, wherein each control signal is coupled to a separate selection circuit, and wherein the control signals configure the inverting difference oscillator as a ring oscillator by forwarding the output from the circuit element path in selected stages and forwarding the bypass path in any other stages to configure the circuit path loop to include an odd number of inverting circuit elements;
wherein one or more of the stages includes a pulse generator circuit coupled to a disable signal,
wherein, when the disable signal is asserted, the pulse generator circuit is configured so that none of a given set of internal inverting circuit elements in the pulse generator circuit is included as inverting circuit elements on the circuit element path in the stage, and
wherein, when the disable signal is deasserted, the pulse generator circuit is configured so that at least some of the given set of internal inverting circuit elements in the pulse generator circuit are included as inverting circuit elements on the circuit element path in the stage.

2. The inverting difference oscillator of claim 1, further comprising one or more circuit elements coupled between the output of a selection circuit in the last stage and the bypass path and the circuit element path in the first stage, wherein the circuit elements are configured to reduce a frequency of oscillation of an oscillating signal in the inverting difference oscillator.

3. The inverting difference oscillator of claim 1, wherein the pulse generator circuit includes:
a NAND gate, wherein an output of the NAND gate is coupled to the disable signal, and wherein a first input of the NAND gate is coupled to a global IDO enable signal and a second input of the NAND gate is coupled to a local enable signal;
wherein when the global IDO enable signal is asserted and the enable signal is asserted, the NAND gate is configured to output a deasserted signal for the disable signal to configure the pulse generator so that the given set of internal inverting circuit elements are included as inverting circuit elements in the circuit element path in the stage.

4. The inverting difference oscillator of claim 3, further comprising:
a local scan element coupled to the local enable signal, wherein the local scan element is configured to output a logical high value on the local enable signal to enable one or more local pulse generator circuits so that the given set of internal inverting circuit elements in each pulse generator circuit is included as inverting circuit elements in a circuit element path in a corresponding stage.

5. The inverting difference oscillator of claim 1, wherein the pulse generator circuit further comprises:
an internal selection circuit coupled to a bypass signal, wherein the internal selection circuit is the selection circuit for the stage;
wherein when the bypass signal is asserted and the enable circuit is deasserted, the internal selection circuit is configured to forward the output of the selection circuit for a previous stage to the circuit element path and the bypass path in a next stage without passing the output through the internal inverting elements in the pulse generator circuit; and
wherein when the bypass signal is deasserted and the disable signal is deasserted, the internal selection circuit is configured to forward the output of the pulse generator circuit, wherein the output of the pulse generator circuit has propagated through the given set of internal inverting circuit elements in the pulse generator circuit.

6. A method for determining a delay of a circuit element using an inverting difference oscillator that includes N stages, wherein each stage includes a circuit element path that includes at least one inverting circuit element; a bypass path; and a selection circuit, wherein one input of the selection circuit is coupled to the circuit element path and another input of the selection circuit is coupled to the bypass path, and wherein an output of the selection circuit is coupled to the bypass path and to the circuit element path in a next stage; and wherein an output of a selection circuit in a last stage is coupled to the bypass path and to the circuit element path that are coupled to the inputs of the selection circuit in a first stage to form a circuit path loop, comprising:
until delays of a predetermined number of different configurations of the inverting difference oscillator have been determined:
configuring the selection circuits to select the circuit element path for selected stages and to select the bypass path for any other stages to configure the circuit path loop to include an odd number of inverting circuit elements, wherein one or more of the stages includes a pulse generator circuit coupled to a disable signal, and wherein configuring the selection circuit includes asserting or deasserting the disable signal, wherein, when the disable signal is asserted, the pulse generator circuit is configured so that none of a given set of internal inverting circuit elements in the pulse generator circuit is included as inverting circuit elements on the circuit element path in the stage, and when the disable signal is deasserted, the pulse generator circuit is configured so that at least some of the given set of internal inverting circuit elements in the pulse generator circuit are included as inverting circuit elements on the circuit element path in the stage;
operating the inverting difference oscillator as a ring oscillator and measuring the operating frequency of the ring oscillator; and
computing the delay for the configuration of the ring oscillator from the measured operating frequency; and
computing the delay of the circuit element using the determined delays.

7. The method of claim 6,
wherein computing the delay of the circuit element includes, in one or more computing devices, performing operations for computing the delay of the circuit element using simplified expressions, wherein the simplified expressions were generated by simplifying mathematical expressions that relate the delay for each configuration to the stages selected for the configuration.

8. The method of claim 6, wherein computing the delay includes storing the computed delay in a computer-readable storage medium or providing the computed delay to a user, another system, or an application.

* * * * *